(12) United States Patent
Hsu et al.

(10) Patent No.: US 7,033,885 B2
(45) Date of Patent: Apr. 25, 2006

(54) DEEP TRENCH STRUCTURE MANUFACTURING PROCESS

(75) Inventors: Ping Hsu, Jhonghe (TW); Kuo-Chien Wu, Miaoli (TW)

(73) Assignee: NANYA Technology Corporation, Taoyuan (TW)

( * ) Notice: Subject to any disclaimer, the term of this patent is extended or adjusted under 35 U.S.C. 154(b) by 81 days.

(21) Appl. No.: 10/671,461

(22) Filed: Sep. 29, 2003

(65) Prior Publication Data

US 2005/0070065 A1 Mar. 31, 2005

(51) Int. Cl.
*H01L 21/8242* (2006.01)
*H01L 21/20* (2006.01)
*H01L 21/76* (2006.01)

(52) U.S. Cl. .................. 438/243; 438/389; 438/390; 438/424

(58) Field of Classification Search ............... 438/243, 438/424, 386–392, 425, 426
See application file for complete search history.

(56) References Cited

U.S. PATENT DOCUMENTS

| 6,080,618 | A  | * | 6/2000 | Bergner et al. ............. 438/243 |
| 6,815,307 | B1 | * | 11/2004 | Hsu et al. .................... 438/389 |
| 6,838,334 | B1 | * | 1/2005 | Gluschenkov et al. ...... 438/243 |
| 2005/0106831 | A1 | * | 5/2005 | Hsu et al. .................... 438/389 |

* cited by examiner

*Primary Examiner*—Walter L. Lindsay, Jr.
(74) *Attorney, Agent, or Firm*—Bacon & Thomas, PLLC

(57) ABSTRACT

Disclosed is a method for manufacturing deep trench structure comprising the steps of providing a substrate; forming a deep trench in the substrate; forming a nitride layer in the deep trench; filling the deep trench with a first conductive layer; removing a portion of the nitride layer not covered by the first conductive layer; refilling the deep trench with another nitride layer so that the sidewall of the deep trench not covered by the first polymer, is covered; partially removing the refilled nitride layer; forming a collar oxide layer in the deep trench; filling the deep trench with a second conductive layer; removing a portion of the collar oxide layer not covered by the second conductive layer; and filling the deep trench with a third conductive layer.

6 Claims, 4 Drawing Sheets

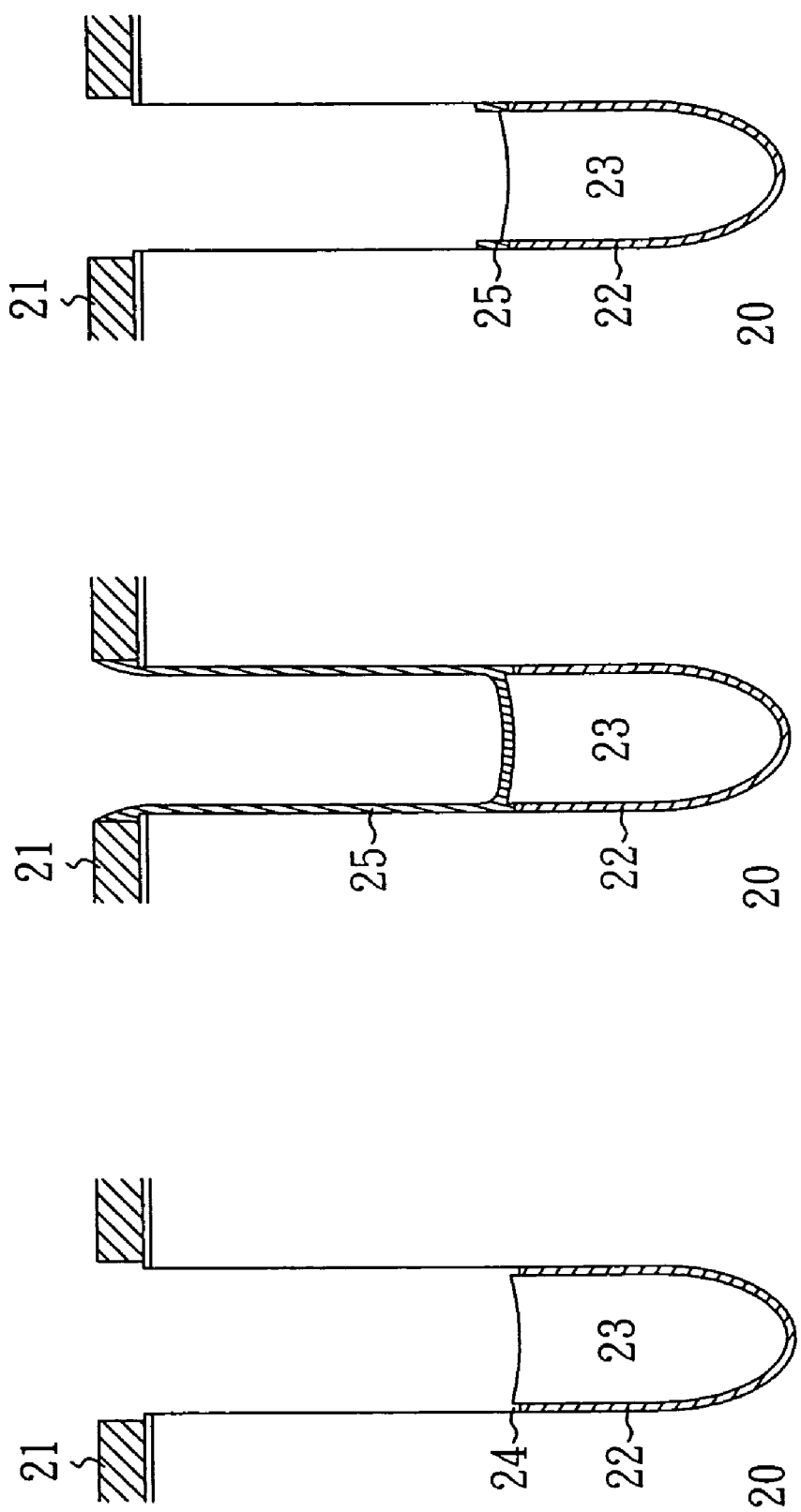

DEEP TRENCH STRUCTURE MANUFACTURING PROCESS

BACKGROUND OF THE INVENTION

1. Field of the Invention

The present invention relates to a semiconductor manufacturing process, more specifically, to a deep trench structure manufacturing process, which is able to reduce leakage problems, thereby improving the electrical performance of products.

2. Description of the Prior Art

In semiconductor deep trench manufacturing process, with reference to FIG. 1a, a deep trench is formed in a substrate 10 on which a pad oxide layer and a pad nitride layer 11 are formed. Then a thin dielectric layer, preferably a nitride layer of which the material is preferably silicon nitride, is formed to cover the sidewall and bottom of the deep trench. Then, a first conductive layer 13 is deposited in the deep trench. The portion of the nitride layer not covered with the first conductive layer 13, which can be poly-silicon, is removed, and the portion of the nitride layer 12 covered with the first conductive layer 13 is left. As shown in the drawing, when the portion of the nitride layer is removed by etching, the nitride layer 12 is usually etched to a level lower than the top of the first conductive layer 13, so that a gap 15 is formed.

Subsequently, according to the deep trench process of the prior art, a portion of the sidewall of the deep trench not covered with the first conductive layer 13 is oxidized by, for example, thermal oxidation to form an oxide layer 14, as shown in FIG. 1b. For the sake of convenient description, the oxide layer 14 refers to a preliminary oxide layer.

An oxide is formed in the deep trench by chemical vapor deposition (CVD) or any other proper method, and etched by dry etching or any other proper method to form a collar oxide layer 16 on the portion of the sidewall of the deep trench not covered with the first conductive layer 13. Then the deep trench is filled with a second conductive layer 17 upon the first conductive layer 13, as shown in FIG. 1c. However, in practical manufacturing process, the collar oxide layer 16 fails to enter the gap 15. Accordingly, the gap 15 still exists even after the collar oxide layer 16 is formed.

Then, portions of the oxide layers 16 and 14 not covered with the second conductive layer 17 are removed by wet etching or any other proper method. Generally, the oxide layers are etched to a level lower than the top of the second conductive layer 17, as shown in FIG. 1d.

Finally, the deep trench is filled with a third conductive layer 18 upon the second conductive layer 17, so that the structure shown in FIG. 1e is finished.

The above process has some problems. As stated above, in the deep trench structure, a gap is likely to be formed between the nitride layer 12 and the collar oxide 16, leading to a path for junction leakage, thereby influencing the sub-threshold leakage and accordingly the performance of the entire structure. In addition, since the formation of the preliminary oxide layer 14 is due to the reaction between sidewall of the deep trench and oxygen, and a portion of the preliminary oxide layer is removed in the step of removing oxide as shown in FIG. 1d, the critical dimensions of the opening and the upper portion of the deep trench are increased, so as to influence the aspect ratio of the deep trench.

Therefore, there is a need for a solution to overcome the problems stated above. The present invention satisfies such a need.

SUMMARY OF THE INVENTION

An objective of the present invention is to provide a deep trench structure manufacturing process, which can avoid a gap being generated in the structure as a path for junction leakage, to reduce sub-threshold leakage and maintain good electrical performance.

Another objective of the present invention is to provide a deep trench structure manufacturing process, which can maintain high aspect ratio for the deep trench.

According to an aspect of the present invention, a deep trench structure manufacturing process comprises the steps of providing a substrate; forming a deep trench in said substrate; forming a dielectric layer in said deep trench, said dielectric layer covering the sidewall and bottom of the deep trench; filling the deep trench with a first conductive layer; removing a portion of said dielectric layer not covered with the first conductive layer; refilling the deep trench with another dielectric layer covering the sidewall of the deep trench not covered with the first conductive layer; partially removing said another dielectric layer; forming a collar oxide layer in the deep trench, said collar oxide layer covering the sidewall of the deep trench not covered with dielectric layers; filling the deep trench with a second conductive layer; removing a portion of said collar oxide layer not covered with the second conductive layer; and filling the deep trench with a third conductive layer.

According to another aspect of the present invention, in the deep trench structure manufacturing process, the material of said another dielectric layer is preferred to be nitride.

According to a further aspect of the present invention, in the deep trench structure manufacturing process, the material of said another dielectric layer is preferred to be silicon nitride.

According to a still further aspect of the present invention, in the deep trench structure manufacturing process, the material of said another dielectric layer is preferred to be the same as that of said dielectric layer.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

FIGS. 2a to 2f are sectional schematic diagrams showing the respective steps of a deep trench manufacturing process in accordance with the present invention.

DETAILED DESCRIPTION OF THE PREFERRED EMBODIMENT

An embodiment of the present invention will be described in detail with reference to the accompanying drawings.

Figure 1C:
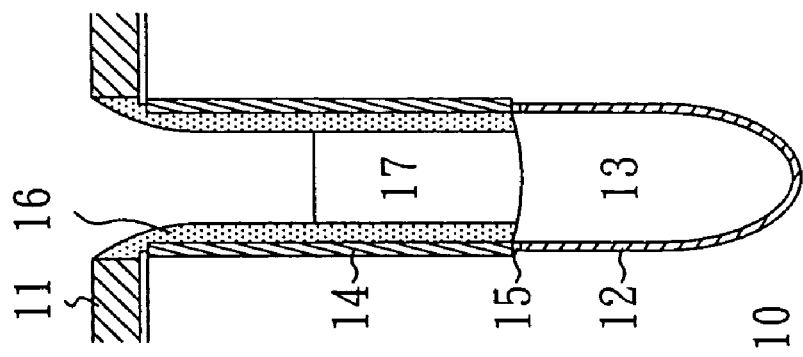
FIGS. 1a to 1e are sectional schematic diagrams showing the respective steps of the prior art deep trench manufacturing process.
Figure 1B:
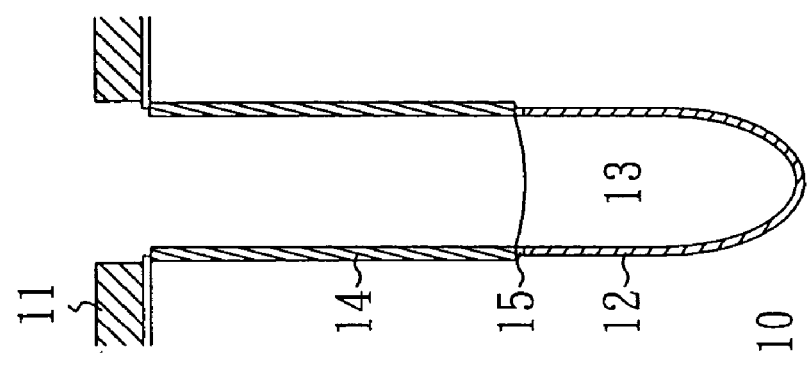
Figure 1A:
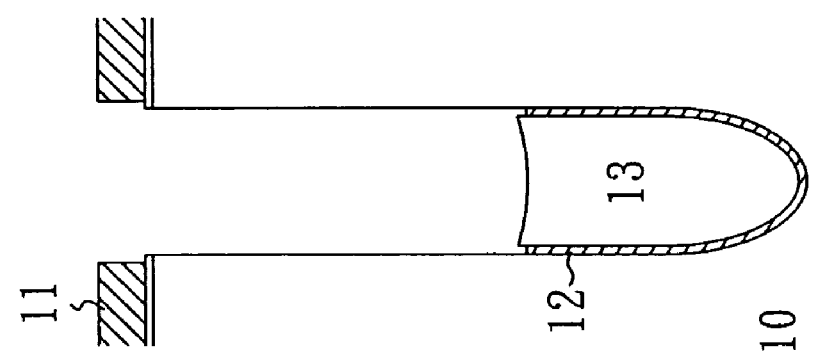
Figure 1D:
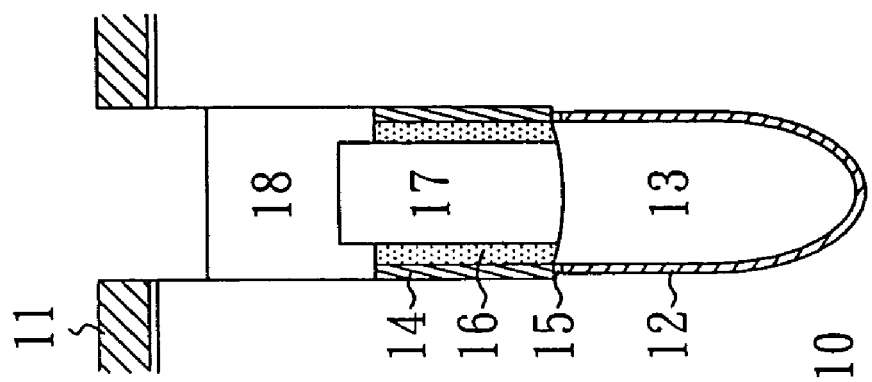
Figure 1E:
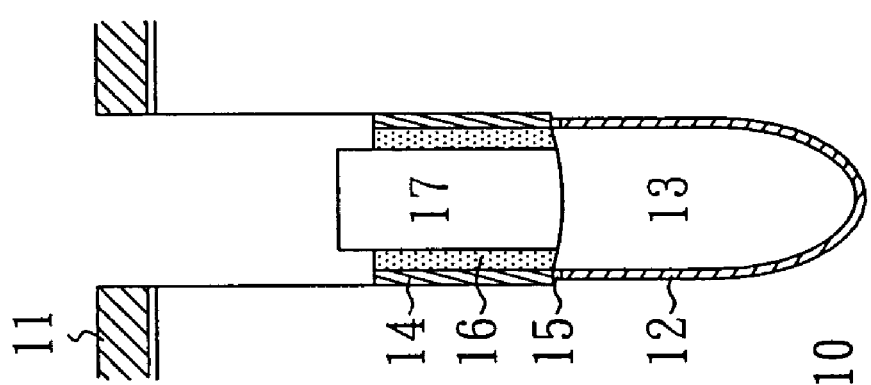

The structure shown in FIG. 2a is identical to that of FIG. 1a, and therefore the description thereof is omitted herein. In this drawing, reference number 20 is a substrate, 21 is a pad nitride layer, 22 is a nitride layer (SiN in general), 23 is a first conductive layer.

Next, with reference to FIG. 2b, a dielectric layer 25 is formed in the deep trench. The material of the dielectric layer 25 is preferably nitride, and more preferably the same as the material of the nitride layer 22. In the present embodiment, the material of the dielectric layer 25 is SiN. After the deep trench is filled with the first conductive layer 23 and the portion of the nitride layer 22 not covered by the first conductive layer 23 is removed, the deep trench is refilled with a nitride layer 25, which his of SiN or any other proper material, so that the sidewall of the deep trench not covered by the first conductive layer 23 is covered by the nitride layer 25. Due to the characteristic of the material, the refilled SiN layer 25 enters into a gap 24 between the sidewall of the deep trench and the first conductive layer 23 in practical process. The gap 24 is generated due to the level of the nitride layer 22 being lower than the first polymer 23.

Then, of the refilled nitride layer 25 is partially removed. Preferably, only the portion of the nitride layer 25 entering into the gap 24 remains, as shown in FIG. 2c.

Figure 2F:
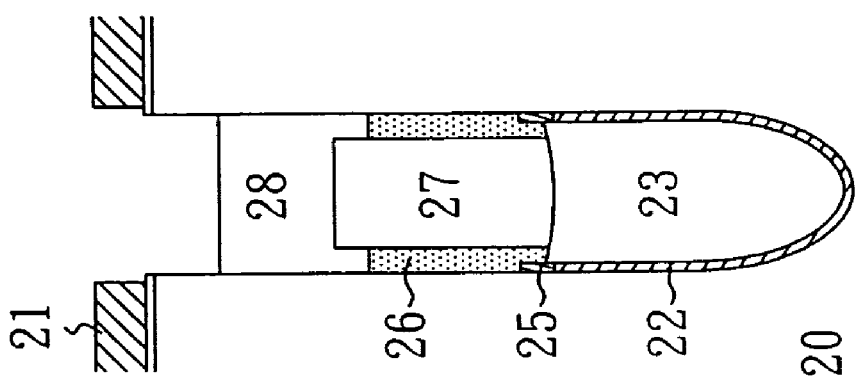
Figure 2E:
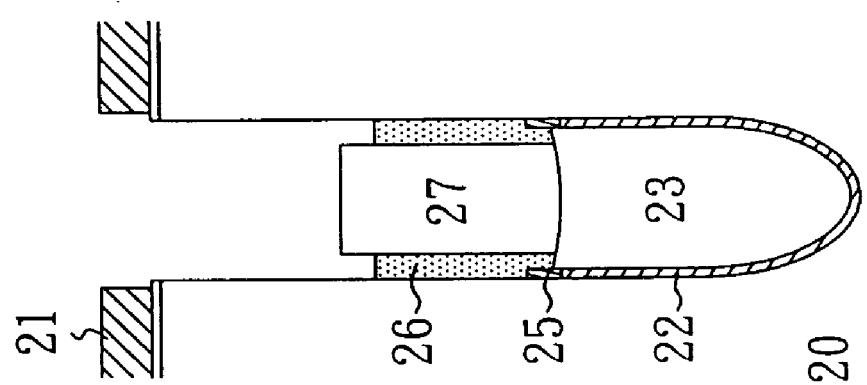
Figure 2D:
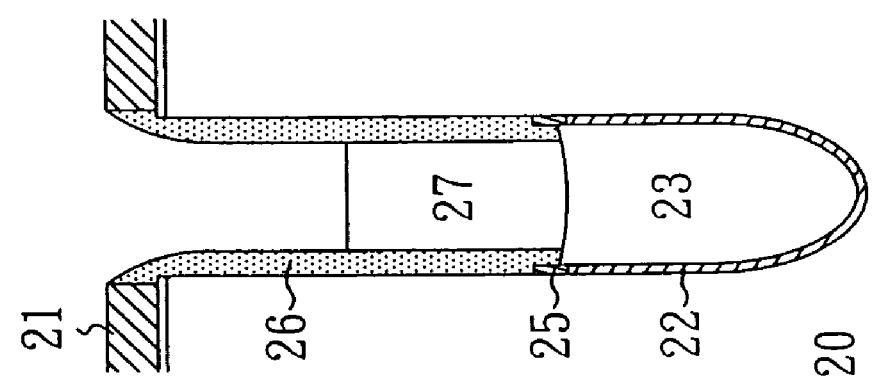

The subsequent process steps are similar to those of the prior art. With reference to FIGS. 2d to 2f, the subsequent steps include forming a collar oxide layer 26, filling the deep trench with a second conductive layer 27, removing an upper portion of the collar oxide layer 26, and finally filling the deep trench with a third polymer 28.

As shown in the drawings, there is no gap existing in the deep structure made by the process in accordance with the present invention. Accordingly, the occurrence of leakage can be reduced, and the sub-threshold performance can be kept good. In addition, the process in accordance with the present invention does not need to form the preliminary oxide layer on the sidewall of the deep trench. Thus, in the step of partially removing the oxide layer, the critical dimension of the diameter of the deep trench will not be increased, and therefore the aspect ratio of the deep trench can be maintained high.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A deep trench structure manufacturing process, comprising the steps of:
   providing a substrate;
   forming a deep trench in said substrate;
   forming a dielectric layer in said deep trench, said dielectric layer covering the sidewall and bottom of the deep trench;
   filling the deep trench with a first conductive layer;
   removing a portion of said dielectric layer not covered by said first conductive layer where a gap is formed between the sidewall of the deep trench and the first conductive layer;
   refilling the deep trench with another dielectric layer, said another dielectric layer covering a portion of the sidewall of the deep trench not covered by said first conductive layer, and covering the gap;
   partially removing said another dielectric layer, while leaving at least a portion thereof filled in the gap;
   forming a collar oxide layer in the deep trench, said collar oxide layer covering a portion of the sidewall of the deep trench not covered by the dielectric layers; filling the deep trench with a second conductive layer;
   removing a portion of said collar oxide layer not covered by said second conductive layer; and
   filling the deep trench with a third conductive layer.

2. The process as recited in claim 1, wherein the material of said dielectric layer is the same as that of said another dielectric layer.

3. The process as recited in claim 2, wherein the material of said dielectric layer and said another dielectric layer is nitride.

4. The process as recited in claim 3, wherein the material of said dielectric layer and said another dielectric layer is silicon nitride.

5. The process as recited in claim 1, wherein said another dielectric layer is a nitride layer.

6. The process as recited in claim 5, wherein the material of said another dielectric layer is silicon nitride.

* * * * *